(12) United States Patent
Ray

(10) Patent No.: US 9,812,291 B2
(45) Date of Patent: Nov. 7, 2017

(54) ALTERNATE MATERIALS AND MIXTURES TO MINIMIZE PHOSPHORUS BUILDUP IN IMPLANT APPLICATIONS

(71) Applicant: Entegris, Inc., Billerica, MA (US)

(72) Inventor: Richard S. Ray, New Milford, CT (US)

(73) Assignee: ENTEGRIS, INC., Billerica, MA (US)

(*) Notice: Subject to any disclaimer, the term of this patent is extended or adjusted under 35 U.S.C. 154(b) by 96 days.

(21) Appl. No.: 14/378,652

(22) PCT Filed: Feb. 14, 2013

(86) PCT No.: PCT/US2013/026064
§ 371 (c)(1),
(2) Date: Aug. 14, 2014

(87) PCT Pub. No.: WO2013/123140
PCT Pub. Date: Aug. 22, 2013

(65) Prior Publication Data
US 2015/0037511 A1 Feb. 5, 2015

Related U.S. Application Data

(60) Provisional application No. 61/598,704, filed on Feb. 14, 2012.

(51) Int. Cl.
*H01J 37/317* (2006.01)
*H01J 37/08* (2006.01)
(Continued)

(52) U.S. Cl.
CPC ...... *H01J 37/3171* (2013.01); *C23C 14/0694* (2013.01); *C23C 14/48* (2013.01);
(Continued)

(58) Field of Classification Search
CPC ......... C23C 14/48; C23C 14/52; C23C 14/54; C23C 14/0694; H91J 37/08; H91J 37/3171; H01J 37/08; H01J 37/3171
See application file for complete search history.

(56) References Cited

U.S. PATENT DOCUMENTS 7,586,109 B2 9/2009 Perel et al.
7,655,931 B2 * 2/2010 Gupta ............... H01J 37/08
250/423 R
(Continued)

FOREIGN PATENT DOCUMENTS

JP 2007-538413 A 12/2007
KR 10-2000-0070906 A 11/2000
(Continued)

*Primary Examiner* — Kelly M Gambetta

(57) ABSTRACT

Systems and processes for utilizing phosphorus fluoride in place of or in combination with, phosphine as a phosphorus dopant source composition, to reduce buildup of unwanted phosphorus deposits in ion implanter systems. The phosphorus fluoride may comprise PF3 and/or PF5. Phosphorus fluoride and phosphine may be co-flowed to the ion implanter, or each of such phosphorus dopant source materials can be alternatingly and sequentially flowed separately to the ion implanter, to achieve reduction in unwanted buildup of phosphorus solids in the implanter, relative to a corresponding process system utilizing only phosphine as the phosphorus dopant source material.

3 Claims, 1 Drawing Sheet

(51) Int. Cl.
*C23C 14/06* (2006.01)
*C23C 14/48* (2006.01)
*C23C 14/52* (2006.01)
*C23C 14/54* (2006.01)

(52) U.S. Cl.
CPC .............. *C23C 14/52* (2013.01); *C23C 14/54* (2013.01); *H01J 37/08* (2013.01); *H01J 2237/006* (2013.01); *H01J 2237/022* (2013.01)

(56) References Cited

U.S. PATENT DOCUMENTS

| | | | |
|---|---|---|---|
| 7,670,964 | B2 | 3/2010 | Lane |
| 7,919,402 | B2 | 4/2011 | Jacobson et al. |
| 7,943,204 | B2 | 5/2011 | Olander et al. |
| 7,947,582 | B2 | 5/2011 | Hautala et al. |
| 8,013,312 | B2 | 9/2011 | Adams |
| 8,187,971 | B2 | 5/2012 | Russell et al. |
| 8,237,136 | B2 | 8/2012 | Hautala et al. |
| 8,252,651 | B2 | 8/2012 | Kawasaki |
| 2002/0014407 | A1 | 2/2002 | Allen et al. |
| 2003/0023118 | A1 | 1/2003 | Kanayama et al. |
| 2004/0166612 | A1 | 8/2004 | Maydan et al. |
| 2004/0235280 | A1 | 11/2004 | Keys et al. |
| 2005/0191816 | A1 | 9/2005 | Vanderpool et al. |
| 2005/0260354 | A1 | 11/2005 | Singh et al. |
| 2006/0097193 | A1 | 5/2006 | Horsky et al. |
| 2007/0087574 | A1 | 4/2007 | Gupta et al. |
| 2007/0148888 | A1 | 6/2007 | Krull et al. |
| 2008/0044960 | A1* | 2/2008 | Al-Bayati ............ H01J 37/321 438/156 |
| 2008/0138967 | A1 | 6/2008 | Li et al. |
| 2008/0230714 | A1 | 9/2008 | Lane |
| 2008/0305598 | A1 | 12/2008 | Horsky et al. |
| 2009/0004806 | A1 | 1/2009 | Siprak |
| 2010/0200954 | A1 | 8/2010 | Del Agua Borniquel et al. |
| 2011/0027957 | A1 | 2/2011 | Berry |
| 2011/0079241 | A1 | 4/2011 | Sinha et al. |

FOREIGN PATENT DOCUMENTS

| | | |
|---|---|---|
| KR | 10-2005-0034731 A | 4/2005 |
| TW | 200901262 A | 1/2009 |
| WO | 9930358 A2 | 6/1999 |
| WO | 2004003973 A2 | 1/2004 |
| WO | 2004013371 A2 | 2/2004 |
| WO | 2005059942 A2 | 6/2005 |
| WO | 2012129454 A2 | 9/2012 |

* cited by examiner

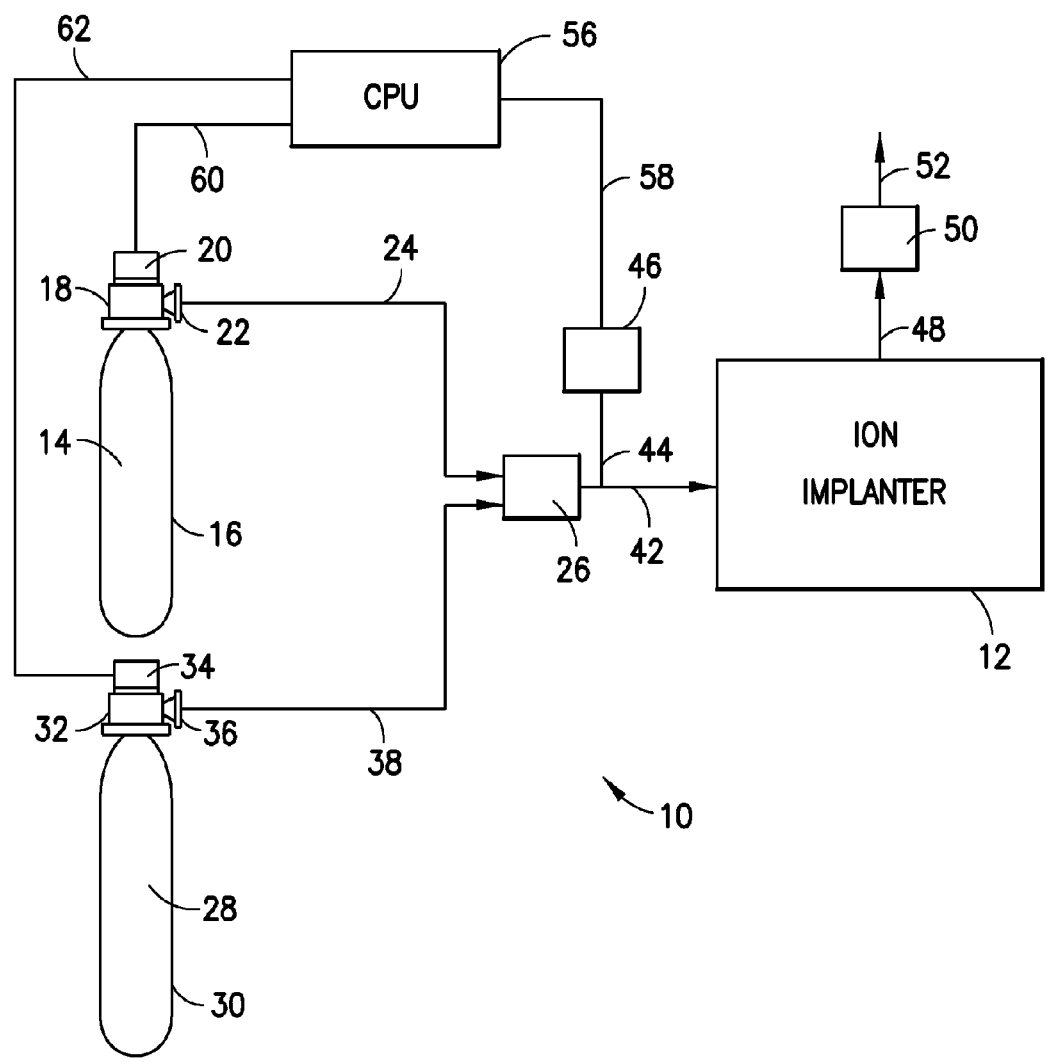

ALTERNATE MATERIALS AND MIXTURES TO MINIMIZE PHOSPHORUS BUILDUP IN IMPLANT APPLICATIONS

CROSS-REFERENCE TO RELATED APPLICATIONS

This application is a U.S. national phase under the provisions of 35 U.S.C. §371 of International Patent Application No. PCT/US13/26064 filed Feb. 14, 2013, which in turn claims the benefit of priority of U.S. Provisional Patent Application No. 61/598,704 filed Feb. 14, 2012 under the provisions of 35 USC 119. The disclosures of International Patent Application No. PCT/US13/26064 and U.S. Provisional Patent Application No. 61/598,704 are hereby incorporated by reference herein, in their respective entireties, for all purposes.

FIELD

The present disclosure relates to ion implantation systems and methods, and more specifically to ion implantation systems and methods in which phosphorus is utilized as a dopant, wherein phosphorus residues and accumulations are reduced in the ion implantation equipment by use of multiple dopant source materials.

DESCRIPTION OF THE RELATED ART

In the practice of ion implantation, phosphorus is a widely used dopant, particularly in semiconductor manufacturing. Phosphorus is frequently employed to bulk dope silicon wafers. In such bulk doping, additional valence electrons are introduced and these electrons become unbonded from individual atoms. As a result, the doped silicon substrate becomes electrically conductive as an n-type semiconductor.

Despite widespread use of phosphorus doping in semiconductor manufacturing and other applications, however, the phosphorus dopant source materials that are commonly used have associated deficiencies that constrain their use and the utility. Such commonly used phosphorus dopant source materials include phosphine ($PH_3$) and elemental phosphorus (P). When used in ion implantation applications, such source materials cause unwanted accumulations of phosphorus residue, in ion source chambers, turbopumps, forelines between turbopumps and roughing pumps, and on beamline surfaces of the implanter.

The unwanted accumulations of phosphorus in the ion implantation apparatus can result in substantial deterioration of the operating efficiency of the implanter, and necessitate its more frequent cleaning and downtime. Buildup of phosphorus may be particularly problematic on surfaces in the ion source region, e.g., on low voltage insulators in the ion source, causing electrical short circuits that can interrupt the arc required to produce therunonic electrons. This phenomenon is generally known as "source glitching." Source glitching is a major contributor to ion beam instabillty, and its continued occurrence may result in premature failure of the ion source. Phosphorus residues depositing on high voltage components of the ion implanter, such as the source insulator or the surfaces of extraction electrodes. can cause energetic high voltage sparking, Such sparking contributes to beam instability, and the energy released in such sparking can damage sensitive electronic components, leading to increased equipment failures and downtime of the implanter unit.

It would therefore be a significant advance in the art to provide improved phosphorus dopant source compositions and methods that achieve substantially reduced accumulations of phosphorus in the ion implanter when phosphorus doping is carried out in the manufacture of semiconductors, flat-panel displays, solar panels, etc.

SUMMARY

The present disclosure relates to ion implantation systems and methods in which phosphorus is utilized as a dopant. The disclosure provides phosphorus dopant source materials that reduce the accumulation of phosphorus residues in ion implantation equipment, in relation to corresponding operation of such equipment utilizing only phosphine ($PH_3$) as the phosphorus dopant source material.

In one aspect, the disclosure relates to a method of ion implantation, comprising: providing an ion implanter configured for phosphorus doping of a substrate; flowing a phosphorus dopant source composition to the ion implanter; and operating the ion implanter to generate phosphorus dopant species from the phosphorus dopant source composition and to implant the phosphorus dopant species in the substrate, wherein the phosphorus dopant source composition comprises phosphorus fluoride.

In another aspect, the disclosure relates to an ion implantation process, comprising: generating phosphorus dopant species by ionization of a phosphorus dopant source composition; and implanting the phosphorus dopant species in a substrate,
wherein phosphorus fluoride constitutes at least part of the phosphorus dopant source composition.

In a further aspect, the disclosure relates to an ion implantation system, comprising: an ion implanter configured to receive phosphorus dopant source material, generate phosphorus dopant species therefrom, and implant the phosphorus dopant species in a substrate; and a supply assembly arranged to deliver phosphorus dopant source material to the ion implanter, wherein the supply assembly comprises phosphorus dopant source material including phosphorus fluoride, and optionally phosphine.

Other aspects, features and embodiments of the disclosure will be more fully apparent from the ensuing description and appended claims.

BRIEF DESCRIPTION OF THE DRAWINGS

FIG. 1 is a schematic representation of an ion implantation system in which the dopant source compositions of the disclosure may be utilized to achieve reduction of unwanted phosphorus deposits in the ion implanter of such ion implantation system.

DETAILED DESCRIPTION

The present disclosure relates to dopant source compositions for phosphorus doping of substrates, e.g., in the manufacture of semiconductors, flat-panel displays, solar energy cells and panels, etc., as well as to ion implantation systems comprising such dopant source compositions, and processes utilizing such dopant source compositions.

More specifically, the present disclosure reflects the discovery that phosphorus dopant source compositions comprising phosphorus fluoride can be used in place of, or in combination with, phosphine as a phosphorus dopant source composition, to reduce buildup of unwanted phosphorus deposits in ion implanter systems.

As used herein, "phosphorus fluoride", also referred to as "$PF_x$", is a fluorophosphorus material including at least one of phosphorus trifluoride, $PF_3$, and phosphorus pentafluoride, $PF_5$. In the formula $PF_x$, ranges in value from 3 to 5 (i.e., encompassing (i) phosphorus trifluoride compositions, when x=3, (ii) phosphorus pentafluoride compositions, when x=5, and (iii) mixtures of phosphorus trifluoride and phosphorus pentafluoride when the value of x is intermediate such end point values. In such mixtures, when x has a value between 3 and 5, the specific value of x will depend on the relative proportions of phosphorus trifluoride and phosphorus pentafluoride to one another in the composition.

In one aspect, the disclosure relates to carrying out an ion implantation process using phosphorus fluoride as a dopant source, e.g., phosphorus trifluoride, or phosphorus pentafluoride, or a mixture of phosphorus trifluoride and phosphorus pentafluoride.

In another aspect, the disclosure relates to carrying out an ion implantation process using a phosphorus dopant source composition comprising phosphorus fluoride and phosphine, wherein the phosphorus fluoride is effective to reduce the amount of phosphorus that is deposited in an ion implanter carrying out the process, in relation to a corresponding ion implanter using phosphine alone as the phosphorus dopant source composition.

As used in combination, phosphorus fluoride and phosphine may be components of a multicomponent phosphorus dopant source composition in which phosphorus fluoride is present in the composition in an amount of from 0.5 to 99.5% by weight, based on total weight of phosphorus fluoride and phosphine in the composition.

Alternatively, phosphorus fluoride and phosphine may be sequentially used as the phosphorus dopant source materials in the ion implantation process, e.g., with a first period of ion implantation being carried out using phosphorus fluoride as the dopant source material, and a second period of ion implantation being carried out using phosphine as the dopant source material, or vice versa. Such sequential use of the respective phosphorus dopant materials may be carried out alternatingly and repetitively, for sufficient duration to effect the required doping of the substrate being subjected to ion implantation. Such sequential alternating use of phosphorus fluoride and phosphine may be carried out so that the periods of doping associated with each phosphorus dopant source material in turn, effects the desired extent and character of overall phosphorus doping of the substrate.

For example, doping using phosphorus fluoride as the dopant source material can be carried out for an equal period of time in relation to a preceding or following doping using phosphine as the dopant source material. Alternatively, the respective periods of phosphorus doping with the different dopant source materials may be unequal to one another, e.g., the periods of doping using phosphorus fluoride as the dopant source material may be 10%, 20%, 30%, 40%, or more, longer than the periods of doping using phosphine as the dopant source material.

In other embodiments, the periods of doping using phosphorus fluoride as a dopant source material may be longer than the periods of doping using phosphine as the dopant source material, e.g., 2-5 times as long as the periods of doping using phosphine as the dopant source material. The disclosure therefore contemplates embodiments in which the doping periods of the respective dopant source materials are unequal in relation to one another, in sequential flows of the respective dopants (phosphorus fluoride and phosphine) to the implanter, as well as operation in which sequential flows of phosphorus fluoride and phosphine are overlapped during a transition period between them, so that during the transition period, the phosphorus fluoride and phosphine are provided in mixture with one another in the ionization chamber of the implanter.

In still other embodiments, the periods of the successive doping operations, using phosphorus fluoride as the dopant source material in one doping operation (i.e., $PF_x$ doping steps) and using phosphine as the dopant source material in preceding or succeeding doping operation (i.e., $PH_3$ doping steps), may be varied continuously, e.g., in absolute length of time and/or in relative proportions to each other, depending on monitored conditions in the ion implantation process. For example, beam intensity, current draw of the ion source, or other condition(s) may be monitored, and a corresponding signal may be sent to a central processor unit (CPU) for processing of monitoring signals and generation of control signals that then are transmitted to operatively control the time sequence and periodicity of the respective $PF_x$ doping steps and the $PH_3$ doping steps. For example, such generate a control signals may be sent via suitable signal transmission lines to valve actuators that are coupled to valves to control the flow of the respective dopant source materials, so that the respective doping operations are modulated in time and duration in response to the monitored process variable(s) in the ion implantation process.

Thus, the disclosure contemplates ion implantation processes in which the phosphorus fluoride is used in place of the phosphine gas that is conventionally used as a phosphorus dopant source, as well as ion implantation processes in which phosphorus fluoride is used in combination (in coflow arrangements, in multicomponent mixtures, or in sequential delivery of the different dopant source materials) with phosphine, to reduce unwanted buildup of phosphorus deposits in the ion implanter, relative to a corresponding ion implanter process in which phosphine is used as the phosphorus dopant source material.

In some specific embodiments, the phosphorus fluoride is the only phosphorus compound in the phosphorus dopant source composition. In other embodiments, the phosphorus dopant source composition does not comprise a diluent gas. In still other embodiments, the phosphorus dopant source composition does not comprise a phosphorus-containing diluent gas.

Referring now to the drawing, FIG. 1 is a schematic representation of an ion implanter system 10 in which the dopant source compositions of the disclosure may be utilized to achieve reduction of unwanted phosphorus deposits.

The ion implanter system 10 includes ion implanter 12, which is arranged to be supplied with phosphorus dopant source gas, from phosphorus fluoride source 14 and from phosphine source 28. Phosphorus fluoride source 14 comprises a vessel 16 holding the phosphorus fluoride in the interior volume of the vessel. The vessel is enclosed at its upper end by a valve head assembly 18, to which is coupled an automatic valve actuator 20 configured to operate the valve element in the valve head assembly so that the valve element can be selectively translated between fully open and fully closed positions, as desired for storage or for dispensing of phosphorus fluoride gas from the vessel.

The valve head assembly 18 of vessel 16 includes a discharge port 22 joined to phosphorus fluoride gas dispensing line 24. The dispensing line 24 is joined at its other end to mixing chamber 26, from which feed line 42 delivers dopant source gas to the ion implanter 12.

The phosphine source 28 is similarly constructed, with a vessel 30 holding phosphine gas in an interior volume of the vessel. The vessel at its upper end is enclosed by valve head assembly 32, to which is operatively coupled an automatic valve actuator 34. The valve head assembly 32 includes discharge port 36. The automatic valve actuator 34 is configured to operate the valve element in the valve head assembly 32 so that the valve element is selectively translated between fully open and fully closed positions, as desired for storage or for dispensing of phosphine gas from the vessel. The discharge port 36 is joined to phosphine gas dispensing line 38, and the phosphine gas dispensing line 38 is joined at its opposite end to mixing chamber 26, from which feed line 42 delivers dopant source gas to the ion implanter 12, as discussed above.

The vessels utilized in the FIG. 1 system, or generally in the practice of the disclosure for delivery of a phosphorus fluoride gas, may be of any suitable type, and may for example comprise vessels of a type utilizing an adsorbent material for storage of the phosphorus dopant source material, in which the dopant source material is adsorbed on the adsorbent in a storage mode of operation and from which the dopant source material is desorbed under dispensing conditions to discharge the dopant source composition from the vessel for flow to the ion implanter. Adsorbent-based vessels of such type are commercially available from ATMI, Inc. (Danbury, Conn., USA) under the trademarks SDS and SAGE.

Alternatively, such phosphorus dopant source material supply vessels may be of a type featuring an internally disposed regulator assembly, wherein the phosphorus dopant source material is stored at elevated pressure, with the regulator or regulators in the internal regulator assembly being arranged with set points permitting the phosphorus dopant source material to be dispensed at significantly lower pressure to the associated flow lines for passage to the ion implanter. Vessels of such type, featuring internally disposed regulator elements, are commercially available from ATMI, Inc. (Danbury, Conn., USA) under the trademark VAC.

The vessels for supplying phosphorus dopant source material can be of any other suitable type, and may optionally include other dopant source material storage media, such as ionic liquids, in which the dopant source material is stored and from which the dopant source material may be extracted or otherwise released under dispensing conditions.

The ion implanter system 10 further includes a central processor unit 56, which may variously be constituted by a general purpose programmable computer, a special purpose programmable computer, a programmable logic controller, a microprocessor, or other computational unit that is configured to monitor and control the system 10.

The CPU 56 is arranged with a signal input line 58 from gas analyzer 46, which receives a sample of the feed gas from feed gas line 42 in branch line 44 and responsively generates a monitoring signal correlative of the composition of the feed gas in line 42. The monitoring signal is sent to CPU 56 in signal input line 58. The CPU then processes the input signal from the gas analyzer and responsively generates output signals for controlling the flow rate and amount of dopant source gas that is delivered to the ion implanter.

The CPU also is arranged with signal output line 60 to valve actuator 20, and signal output line 62 to valve actuator 34.

The ion implanter 12 is arranged to discharge effluent in line 48 to the effluent abatement treatment facility 50. In such facility, the effluent is treated, e.g., by scrubbing, catalytic oxidation, and/or other effluent treatment operations, to produce a treated effluent that is discharged from the treatment facility 50 in vent line 52.

In operation, the CPU may be configured to carry out ion implantation processing by actuating one or both of the automatic valve actuators 20 and 34, to flow dopant source gas to the mixing chamber 26 through corresponding dispensing lines 24 and/or 38. If only one of the dopant sources 14 and 28 is being operated in dispensing mode, then the dopant source gas flowing into the mixing chamber 26 is simply flowed through such chamber into feed line 42 to the ion implanter 12. If both of the dopant sources 14 and 28 are being operated in dispensing mode, then the mixing chamber receives both phosphorus fluoride and phosphine, and forms a corresponding mixture of the two dopant gases, to produce a multicomponent dopant gas mixture that is flowed in feed gas line 42 to the ion implanter 12.

The dopant source gas in line 42 is monitored by the gas analyzer 46 to generate a monitoring signal that processed by the CPU and used to modulate the automatic valve actuators so that the proper flow of each dopant source gas is effected. This may involve alternating phosphorus fluoride and phosphine from the respective sources 14 and 28, or flowing both phosphorus fluoride and phosphine from their respective sources to the mixing chamber 26, and modulating the flow rate of each dopant source gas to maintain a predetermined or otherwise appropriate composition of the dopant gas mixture that is delivered in line 42 to the ion implanter.

As thus constituted, the FIG. 1 system has the capability of utilizing only phosphorus fluoride, or only phosphine, as a dopant source gas for the ion implantation operation conducted in the ion implanter 12. Accordingly, the ion implantation system may be configured for sequential flow operation in which only phosphorus fluoride is delivered by the supply assembly to the ion implanter in one period of operation, and only phosphine is delivered by the supply assembly to the ion implanter in another period of operation, e.g., with the respective flows of the different phosphorus compounds being separate and independent from one another, or alternatively, with the respective periods overlapping one another, so that there is a transitional period of processing of a mixture of the phosphorus fluoride and the phosphine.

Alternatively, the respective phosphorus fluoride and phosphine dopant source gases can be concurrently flowed (i.e., co-flowed) to the ion implanter 12 during the entire period of doping operation, being first introduced to mixing chamber 26, wherein a homogenous composition of the respective phosphorus source gases is effected, following which the resulting multi-component dopant source gas mixture is flowed in line 42 to the ion implanter. As a still further alternative, each of the co-flow gases may be delivered by separate conduits or flow circuitry to the ion implanter, e.g., for mixing in the ion source region of the implanter.

The gas composition is monitored in real time by the gas analyzer 46, with a correlative signal being sent via signal transmission line 58 to the CPU 56. The CPU 56 in turn processes such signal and generates corresponding output signals that are sent in signal transmission lines 60 and 62 to modulate the flow of the respective dopant source gases from vessels 16 and 28, via actuation or de-actuation of the automatic valve actuators 20 and 34, respectively, to achieve a desired composition as monitored by the gas analyzer. The valve actuators 20 and 34 thereby effect translation of the valve elements in the respective valve head assemblies 18 and 32, to achieve desired volumetric flow rates of the respective gases so that the desired relative proportions are mixed with one another in the mixing chamber 26.

The ion implanter 12 produces an effluent that is discharged in effluent discharge line 48 from the implanter and flowed to the treatment facility 50, wherein the effluent is treated and discharged via vent line 52 to further treatment or other disposition, e.g., release to the ambient atmosphere of the semiconductor manufacturing facility containing the ion implanter.

As a further mode of operation, the respective phosphorus fluoride and phosphine dopant source gases can be sequentially flowed in an alternating, repetitive cycle. In such mode of operation, the durations of the respective phosphorus fluoride and phosphine flows to the ion implanter may be selected and varied by action of the CPU 56, which for such purpose may be programmatically arranged to modulate the actuators 20 and 34 of valve head assemblies 18 and 32 of vessels 16 and 30, respectively. As previously described, the durations and volumetric flows of the respective dopant source gases in the respective cycle portions of the overall sequence may be substantially varied as necessary or desired, to achieve a specific operational character consistent with reduction of phosphorus deposits in the ion implanter.

It will be recognized that the FIG. 1 system may be further augmented by provision of cleaning apparatus, and cleaning agents for removing accumulations of phosphorus in the ion implanter 12. Such equipment and compositions may for example include a vessel similar to vessels 16 and 30, containing a gaseous cleaning agent that is selectively and periodically introduced to the ion implanter, or alternatively is co-flowed with the phosphorous dopant source material to the ion implanter, to reactively remove the phosphorus deposits, or otherwise effect their elimination from the ion implanter to achieve cleaning thereof.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. An ion implantation system, comprising:
   an ion implanter arranged to receive phosphorus dopant source material, generate phosphorus dopant species therefrom, and implant the phosphorus dopant species in a substrate; and
   a supply assembly arranged to deliver phosphorus dopant source material to the ion implanter, wherein the supply assembly comprises one of:
   (i) phosphorus dopant source material supply vessels comprising a first supply vessel holding a first phosphorus dopant composition, and a second supply vessel holding a second phosphorus dopant composition, wherein the first and second phosphorus dopant compositions are different from one another, and wherein the supply assembly is arranged to deliver the first phosphorus dopant composition to the ion implanter during a first period of phosphorus ion implantation, and to deliver the second phosphorus dopant composition to the ion implanter during a second period of phosphorus ion implantation, the supply assembly comprising a gas analyzer configured to analyze a composition of the phosphorus dopant source material delivered to the ion implanter and central processor unit in communication with the gas analyzer and arranged to controllably dispense the first and second phosphorus dopant compositions to the ion implanter during ion implantation operation thereof during said first and second periods, respectively, to achieve a desired composition of the phosphorus dopant source material as determined by the gas analyzer; or
   (ii) a phosphorus dopant source material mixing vessel holding a phosphorus dopant source mixture comprising different phosphorus fluorides, and wherein the supply assembly is configured to deliver the phosphorus dopant source mixture to the ion implanter, the supply assembly comprising a gas analyzer configured to analyze a composition of the phosphorous dopant source mixture delivered to the ion implanter during an implantation operation thereof and a central processor unit in communication with the gas analyzer arranged to controllably control a supply of the different phosphorus fluorides to the mixing vessel to achieve a desired composition of the phosphorous dopant source mixture delivered to the ion implanter as determined by the gas analyzer.

2. The system of claim 1, wherein the supply assembly comprises phosphorus dopant source material supply vessels comprising a first supply vessel holding a first phosphorus dopant composition, and a second supply vessel holding a second phosphorus dopant composition, wherein the first and second phosphorus dopant compositions are different from one another, and wherein the supply assembly is arranged to deliver the first phosphorus dopant composition to the ion implanter during a first period of phosphorus ion implantation, and to deliver the second phosphorus dopant composition to the ion implanter during a second period of phosphorus ion implantation, the supply assembly comprising a gas analyzer configured to analyze a composition of the phosphorous dopant source material delivered to the ion implanter and a central processor unit in communication with the gas analyzer and arranged to controllably dispense the first and second phosphorus dopant compositions to the ion implanter during ion implantation operation thereof during said first and second periods, respectively, to achieve a desired composition of the phosphorous dopant source material as determined by the gas analyzer.

3. The system of claim 1, wherein the supply assembly comprises a phosphorus dopant source material supply vessel holding a phosphorus dopant source mixture comprising different phosphorus fluorides, and wherein the supply assembly is arranged to deliver the phosphorus dopant source mixture to the ion implanter, the supply assembly comprising a gas analyzer configured to analyze a composition of the phosphorous dopant source mixture delivered to the ion implanter during an implantation operation thereof and a central processor unit in communication with the gas analyzer arranged to controllably control a supply of the different phosphorous fluorides to the mixing vessel to achieve a desired composition of the phosphorous dopant source mixture delivered to the ion implanter as determined by the gas analyzer.

\* \* \* \* \*